(12) United States Patent
Yang

(10) Patent No.: US 10,833,007 B2
(45) Date of Patent: Nov. 10, 2020

(54) CIRCULAR RING SHAPE FUSE DEVICE

(71) Applicant: International Business Machines Corporation, Armonk, NY (US)

(72) Inventor: Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/242,598

(22) Filed: Jan. 8, 2019

(65) Prior Publication Data

US 2020/0219812 A1    Jul. 9, 2020

(51) Int. Cl.
*H01L 23/52* (2006.01)
*H01L 23/525* (2006.01)
*H01L 27/112* (2006.01)

(52) U.S. Cl.
CPC .... *H01L 23/5256* (2013.01); *H01L 27/11206* (2013.01)

(58) Field of Classification Search
CPC ..... H01L 2924/00014; H01L 23/53238; H01L 23/5226; H01L 21/76843; H01L 21/76877; H01L 21/7684; H01L 21/76846; H01L 23/53266; H01L 2924/00012; H01L 2224/03848; H01L 21/76883; H01L 23/5228; H01L 21/76834; H01L 2224/0345; H01L 2224/03452; H01L 2224/05647; H01L 23/528; H01L 21/76831; H01L 21/76879; H01L 21/76802; H01L 2224/03616; H01L 2224/11848; H01L 23/53252; H01L 23/5329; H01L 2924/00015; H01L 21/76816; H01L 2224/94; H01L 23/53223; H01L 21/76847; H01L 21/76897; G06F 30/398; G06F 2119/18; G06F 30/367; G06F 30/394; G06F 2111/02; G06F 2119/06; G06F 2119/10; G06F 21/64; G06F 30/392; G11C 13/0007; G11C 13/0069; G11C 2213/15; G11C 2213/32; G11C 2213/52; G11C 13/0023; G11C 13/003;
(Continued)

(56) References Cited

U.S. PATENT DOCUMENTS 4,227,168 A    10/1980  Knapp, Jr.
4,228,417 A    10/1980  Belcher
(Continued)

OTHER PUBLICATIONS

Rizzolo, R. F., et al., "IBM System z9 eFUSE applications and methodology", IBM J. Res. & Dev., Jan./Mar. 2007, pp. 65-75, vol. 51, No. 1/2.
(Continued)

*Primary Examiner* — Robert G Bachner
(74) *Attorney, Agent, or Firm* — Scully, Scott, Murphy & Presser, P.C.; Alvin Borromeo, Esq.

(57) ABSTRACT

An electrical fuse (e-fuse) is provided in which the contact area between the fuse element (i.e., fuse link) and the first and second electrodes is reduced. The reduction in contact area provides high electron density and enhanced programming efficiency to the electrical fuse. The fuse element of the present application, which is sandwiched between the first and second electrodes, has a circular ring shape. A dielectric material laterally surrounds the fuse element and is present in the center of the circular ring shaped fuse element.

11 Claims, 4 Drawing Sheets

(58) Field of Classification Search
CPC .............. G11C 13/004; G11C 13/0097; G11C 2013/0078; G11C 2013/0083; G11C 2213/51; G11C 2213/70

See application file for complete search history.

(56) References Cited

U.S. PATENT DOCUMENTS

| | | | |
|---|---|---|---|
| 4,240,058 A | 12/1980 | Kozacka et al. | |
| 4,245,208 A | 1/1981 | Belcher | |
| 4,254,394 A | 3/1981 | Kozacka et al. | |
| 4,272,752 A | 6/1981 | Jacobs, Jr. | |
| 4,306,212 A | 12/1981 | Belcher | |
| 5,949,323 A | 9/1999 | Huggins et al. | |
| 6,754,135 B2 | 6/2004 | Pilo | |
| 6,897,543 B1 | 5/2005 | Huang et al. | |
| 6,998,865 B2 | 2/2006 | Bard et al. | |
| 7,157,782 B1 | 1/2007 | Shih et al. | |
| 7,272,067 B1 | 9/2007 | Huang et al. | |
| 7,388,273 B2 | 6/2008 | Burr et al. | |
| 7,557,424 B2 | 7/2009 | Wong et al. | |
| 7,709,325 B2 | 5/2010 | Joseph et al. | |
| 7,981,755 B2 | 7/2011 | Breitwisch et al. | |
| 8,053,809 B2 | 11/2011 | Cheng et al. | |
| 8,400,813 B2 | 3/2013 | Lee | |
| 9,514,905 B2 | 12/2016 | Redaelli et al. | |
| 2002/0185689 A1* | 12/2002 | Cabral, Jr. | C23C 14/0073 257/368 |
| 2004/0217441 A1* | 11/2004 | Lehmann | H01L 23/5252 257/530 |
| 2006/0017153 A1* | 1/2006 | Choi | H01L 23/5223 257/700 |
| 2006/0214261 A1 | 9/2006 | You et al. | |
| 2008/0048169 A1* | 2/2008 | Doyle | G11C 13/0004 257/4 |
| 2012/0187528 A1 | 7/2012 | Cheng et al. | |
| 2016/0374203 A1 | 12/2016 | Bakre et al. | |

OTHER PUBLICATIONS

Kothandaraman, C., et al.,"Electrically Programmable Fuse (eFUSE) Using Electromigration in Silicides", IEEE Electron Device Letters, Sep. 2002, pp. 523-525, vol. 23, No. 9.

* cited by examiner

CIRCULAR RING SHAPE FUSE DEVICE

BACKGROUND

The present application relates to an electrical fuse (i.e., e-fuse) and a method of forming the same. More particularly, the present application relates to an e-fuse having enhanced programming efficiency and a method of forming the same.

An e-fuse is a structure that is blown in accordance with a suitable electrical current. For example, an electrical current is provided through the e-fuse to eventually cause the fuse to blow and create an open circuit. Programming refers to intentionally blowing an e-fuse and creating the open circuit. In integrated circuitry memory devices, e-fuses can be used for activating redundancy in memory chips and for programming functions and codes in logic chips. Specifically, dynamic random access memory (DRAM) and static random access memory (SRAM) may employ e-fuses for such purposes.

E-fuses can also be used to prevent decreased chip yield caused by random defects generated in the manufacturing process. Moreover, e-fuses may provide for future customization of a standardized chip design. For example, e-fuses may provide for a variety of voltage options, packaging pin out options, or any other options desired by the manufacturer to be employed prior to the final processing. These customization possibilities make it easier to use one basic design for several different end products and help increase chip yield.

Increased local density of an e-fuse has been obtained by modification of a plan-view layout of the fuse. For example, a two-dimensional "dog-bone" shape e-fuse having a small cross-sectional area between the cathode and the anode increases local current density, and has been adopted in the semiconductor industry as an e-fuse for improved process control and higher programming efficiency.

Programming of such prior art e-fuses typically takes a substantial amount of current due to the large contact area between the fuse element (i.e., fuse link) and the two electrodes (i.e., the anode and cathode), which is undesirable in current technology node devices using low driving current. There is thus a need to provide an e-fuse that has less contact area which can afford improved programming efficiency.

SUMMARY

An electrical fuse (e-fuse) is provided in which the contact area between the fuse element (i.e., fuse link) and the first and second electrodes is reduced. The reduction in contact area provides high electron density and enhanced programming efficiency to the electrical fuse. The fuse element of the present application, which is sandwiched between the first and second electrodes, has a circular ring shape. A dielectric material laterally surrounds the fuse element and is present in the center of the circular ring shaped fuse element.

In one aspect of the present application, an electrical fuse having a high electron density and enhanced programming efficiency is provided. In one embodiment, the electrical fuse includes a fuse element having a circular ring shape comprising an outer perimeter sidewall and an inner perimeter sidewall and located on a first electrode. A dielectric material laterally surrounds the inner perimeter sidewall and the outer perimeter sidewall of the fuse element. A second electrode is located above, and in contact, with the fuse element.

In another aspect of the present application, a method of forming an electrical fuse having a high electron density and enhanced programming efficiency is provided. In one embodiment of the present application, the method includes forming an opening in a dielectric material that is present on a surface of a first electrode, wherein the opening is circular having an inner perimeter and an outer perimeter. A fuse element is then formed in the opening. The fuse element has a circular ring shape comprising an outer perimeter sidewall and an inner perimeter sidewall. The fuse element is laterally surrounded by the dielectric material. Next, a second electrode is formed above, and in contact, with the fuse element.

DETAILED DESCRIPTION

Figure 1:
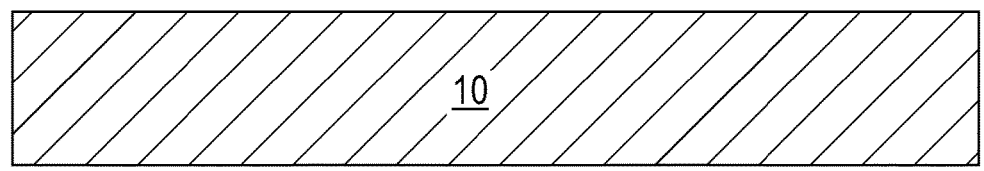
FIG. 1 is a cross sectional view of an exemplary electrical fuse of the present application during an early stage of fabrication and including a first electrode.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary electrical fuse of the present application during an early stage of fabrication and including a first electrode 10. The first electrode 10 may be present on a surface of a substrate (not shown). In one embodiment, the substrate is a semiconductor material that has semiconducting properties and which contains one or more semiconductor devices such as, for example, transistors, formed thereon. In another embodiment, the substrate is an interconnect level including an interconnect dielectric material that contains one or more electrically conductive structures embedded thereon. In such an embodiment, the interconnect level is located above a semiconductor material having semiconducting properties and containing one or more semiconductor devices formed thereon.

Notwithstanding the type of substrate employed, the first electrode 10 is composed of an electrically conductive metal or metal alloy. Examples of electrically conductive metals that may be employed as the first electrode 10 include, but are not limited to, copper (Cu), aluminum (Al), tungsten (W), cobalt (Co), ruthenium (Ru), tantalum (Ta), or titanium (Ti). Examples of electrically conductive metals that may be employed as the first electrode 10 include, but are not limited to, any combination of the above mentioned metals (i.e., a Cu—Al alloy) or any above mentioned metals in a nitride form (i.e., TaN, TiN, or WN).

The electrically conductive metal or metal alloy that provides the first electrode 10 can be formed utilizing a deposition process such as, for example, chemical vapor deposition (CVD), plasma enhanced chemical vapor deposition (PECVD), sputtering, chemical solution deposition or plating. The first electrode 10 may have a thickness from 10 nm to 200 nm; although other thicknesses are possible and can be used as the thickness of the first electrode 10.

In some embodiments, the blanket layer of the electrically conductive metal or metal alloy itself provides the first electrode 10. In other embodiments, the blanket layer of the electrically conductive metal or metal alloy is patterned by lithography and etching to provide the first electrode 10. In such an embodiment (not shown), a dielectric material (not shown) can be formed so as to laterally surround the patterned first electrode 10.

Figure 2A:
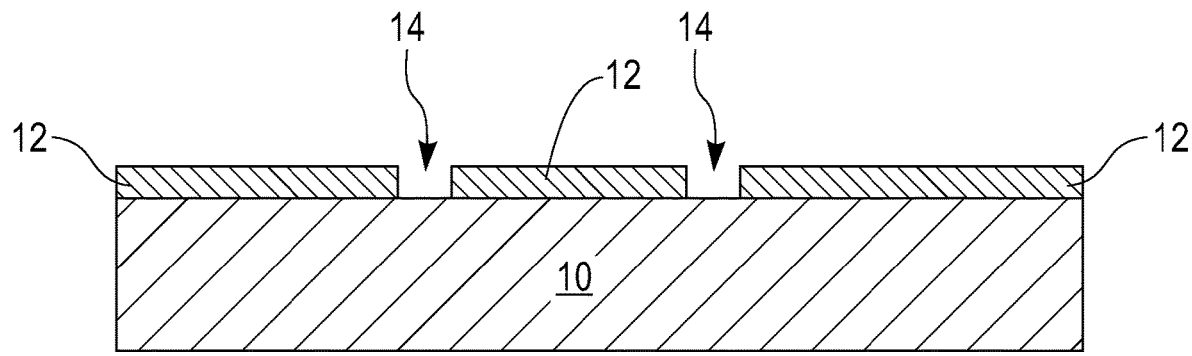
FIG. 2A is a cross sectional view of the exemplary electrical fuse of FIG. 1 after forming a dielectric material having an opening on a surface of the first electrode.
Figure 2B:
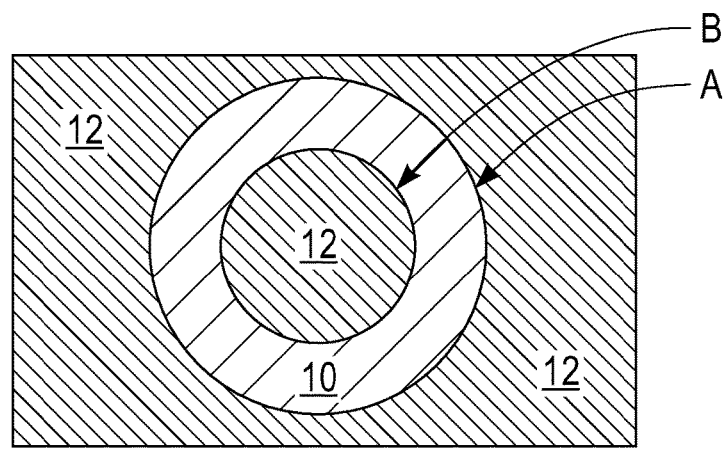
FIG. 2B is a top down view of the exemplary electrical fuse structure of FIG. 2A.

Referring now to FIG. 2, there is illustrated the exemplary electrical fuse of FIG. 1 after forming a dielectric material 12 having an opening 14 on a surface of the first electrode 10. The opening 14 is circular having an outer perimeter, A, and an inner perimeter, B, and physically exposes a portion of the first electrode 10. Also, the dielectric material 12 laterally surrounds the outer perimeter, A, of the opening 14 and the inner perimeter, B, of the opening 14. This is clearly shown in FIG. 2B of the present application. That is, a portion of dielectric material 12 is located laterally adjacent to the inner perimeter, B, of the opening 14, and another portion of dielectric material 12 is located laterally adjacent to the outer perimeter, A, of the opening 14. The inner perimeter, B, of the opening 14 is spaced apart from the outer perimeter, A, of the opening 14.

The dielectric material 12 may include silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric materials. The dielectric material 12 can be formed utilizing a deposition process such as, for example, CVD, PECVD, atomic layer deposition (ALD), chemical solution deposition or evaporation. The dielectric material 12 can have a thickness from 10 nm to 100 nm. Other thicknesses that are lesser than 10 nm, or greater than 100 nm may also be used as the thickness of the dielectric material. The circular opening 14 is formed into the as deposited dielectric material 12 by lithography and etching.

Figure 3A:
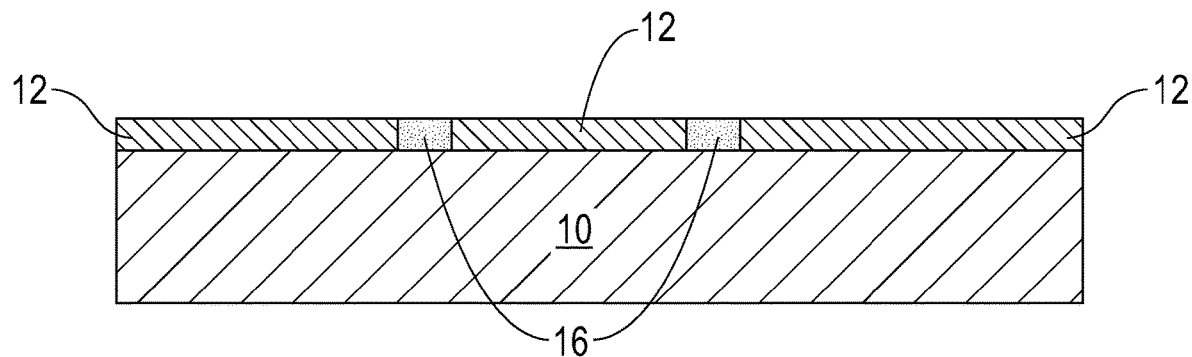
FIG. 3A is a cross sectional view of the exemplary electrical fuse of FIGS. 2A-2B after forming a fuse element in the opening.

Referring now to FIG. 3A, there is illustrated the exemplary electrical fuse of FIG. 2 after forming a fuse element 16 in the opening 14. Since opening 14 is circular, the fuse element 16 is circular ring shape as is clearly seen in FIG. 3B of the present application. By "circular ring shape" it is meant a structure or material has a shape of a cylinder or donut including an outer perimeter sidewall, 16A, and an inner perimeter sidewall, 16B. The inner perimeter sidewall, 16B, of the fuse element 16 is spaced apart from the outer perimeter sidewall, 16A, of the fuse element 16. A hole (i.e., circular opening) is present in the center of the fuse element 16. In accordance with the present application, the hole (i.e., circular opening) of the circular ring shaped fuse element 16 contains a portion of the dielectric material 14. The portion of the dielectric material 14 that is contained within the circular opening of the circular ring shaped fuse element 16 is spherical (i.e., a solid circle) and may have a diameter from 5 nm to 500 nm.

Fuse element 16 includes one of the electrically conductive metals or metal alloys mentioned above for the first electrode 10. In some embodiments, the fuse element 16 is composed of a same electrically conductive metal or metal alloy as the first electrode 10 and/or the second electrode 24 to be subsequently formed. In other embodiments, the fuse element 16 is composed of a compositionally different electrically conductive metal or metal alloy than the first electrode 10 and/or the second electrode 24 to be subsequently formed. The electrically conductive metal or metal alloy that provides the fuse element 16 may be formed utilizing one of the deposition processes mentioned above in forming the first electrode 10. Following deposition of the electrically conductive metal or metal alloy that provides the fuse element 16, a planarization process such as, for example, chemical mechanical polishing and/or grinding can be performed to provide the final fuse element 16. As is shown in FIG. 3A, fuse element 16 has a topmost surface that is coplanar with a topmost surface of dielectric material 12. Fuse element 16 has a same thickness as dielectric material 12.

Figure 3B:
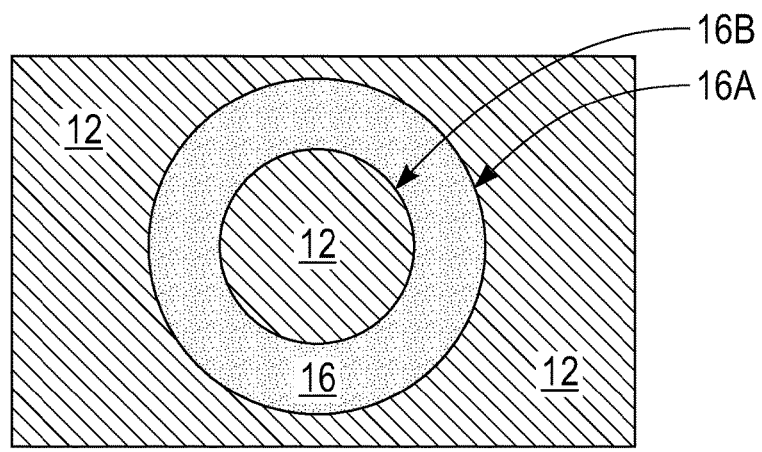
FIG. 3B is a top down view of the exemplary electrical fuse structure of FIG. 3A.
Figure 4:
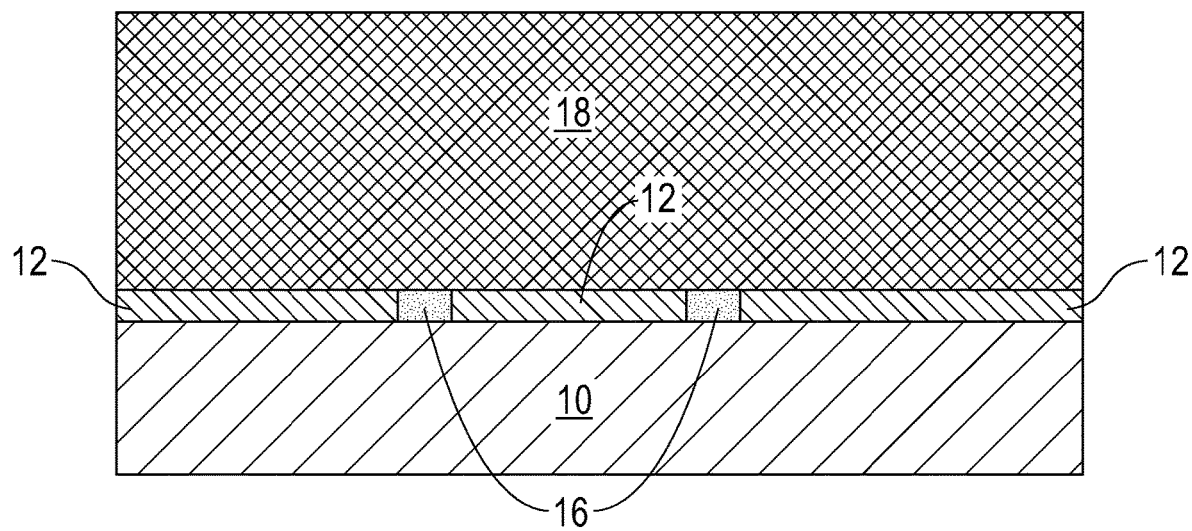
FIG. 4 is a cross sectional view of the exemplary electrical fuse of FIGS. 3A-3B after forming an interconnect dielectric material.

Referring now to FIG. 4, there is illustrated the exemplary electrical fuse of FIGS. 3A-3B after forming an interconnect dielectric material 18. As is illustrated, the interconnect dielectric material 18 is formed on fuse element 16 and the dielectric material 12.

The interconnect dielectric material 18 is composed of an inorganic dielectric material or an organic dielectric material which is typically, but not necessarily always, compositionally different from the dielectric material 12. In some embodiments, the interconnect dielectric material 18 may be porous. In other embodiments, the interconnect dielectric material 18 may be non-porous. Examples of suitable dielectric materials that may be employed as the interconnect dielectric material 18 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

In some embodiments, the interconnect dielectric material 18 may have a dielectric constant of about 4.0 or less. In one example, the interconnect dielectric material 18 can have a dielectric constant of 2.8 or less. These dielectrics generally having a lower parasitic cross talk as compared to dielectric materials whose dielectric constant is greater than 4.0.

The interconnect dielectric material 18 can be formed by a deposition process such as, for example, CVD, PECVD or spin-on coating. The interconnect dielectric material 18 can have a thickness from 50 nm to 250 nm. Other thicknesses that are lesser than 50 nm, and greater than 250 nm can also be employed in the present application as the thickness of the interconnect dielectric material 18.

Figure 5A:
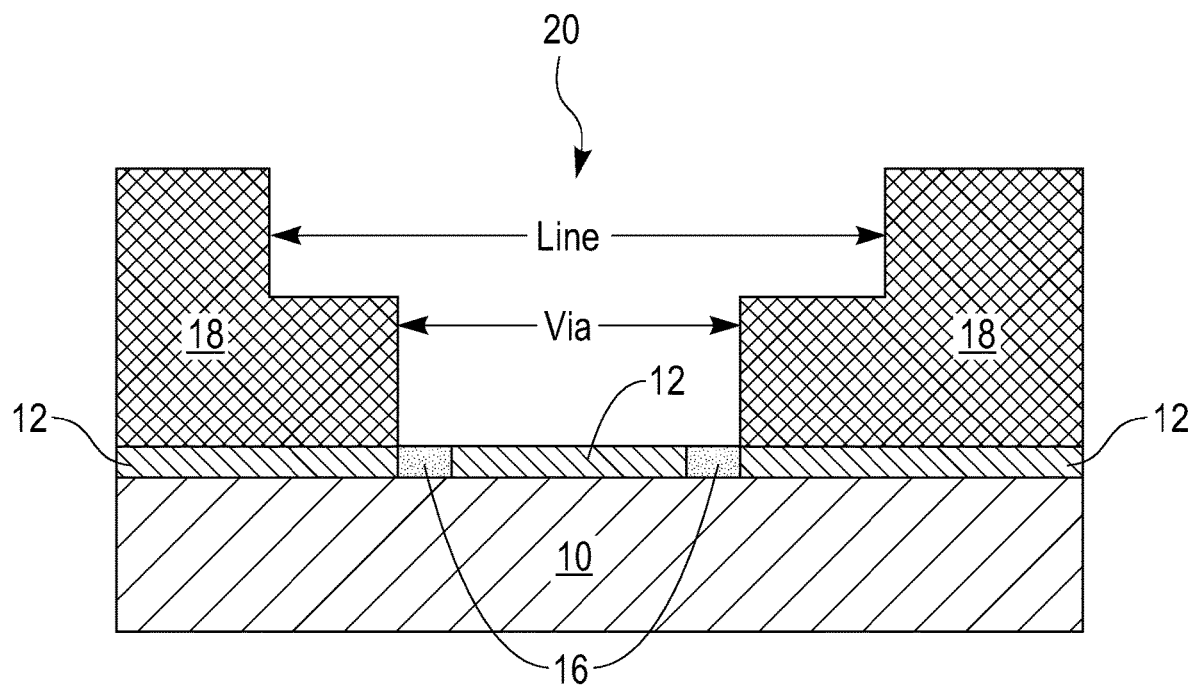
FIG. 5A is a cross sectional view of the exemplary electrical fuse of FIG. 4 after forming an opening having a lower via portion and an upper line portion in the interconnect dielectric material in accordance with an embodiment of the present application.

Referring now to FIG. 5A, there after forming an opening 20 having a lower via portion (via) and an upper line portion (line) in the interconnect dielectric material 18 in accordance with an embodiment of the present application. Opening 20 physically exposes the entirety of the dielectric material 12 that is located between the fuse element 16 as well as the fuse element 16 itself. In some embodiments, an entirety of the fuse element 16 is physically exposed. In other embodiments, only a portion of the fuse element 16 is physically exposed.

The opening 20 is formed utilizing two iterations of lithography and etching. As is shown, the line portion of the opening 20 has a width that is greater than a width of the via portion of the opening 20. In one example, the width of the via portion of the opening 20 is from 10 nm to 600 nm, while the width of the line portion of the opening 20 is from 10 nm to 1500 nm.

Figure 5B:
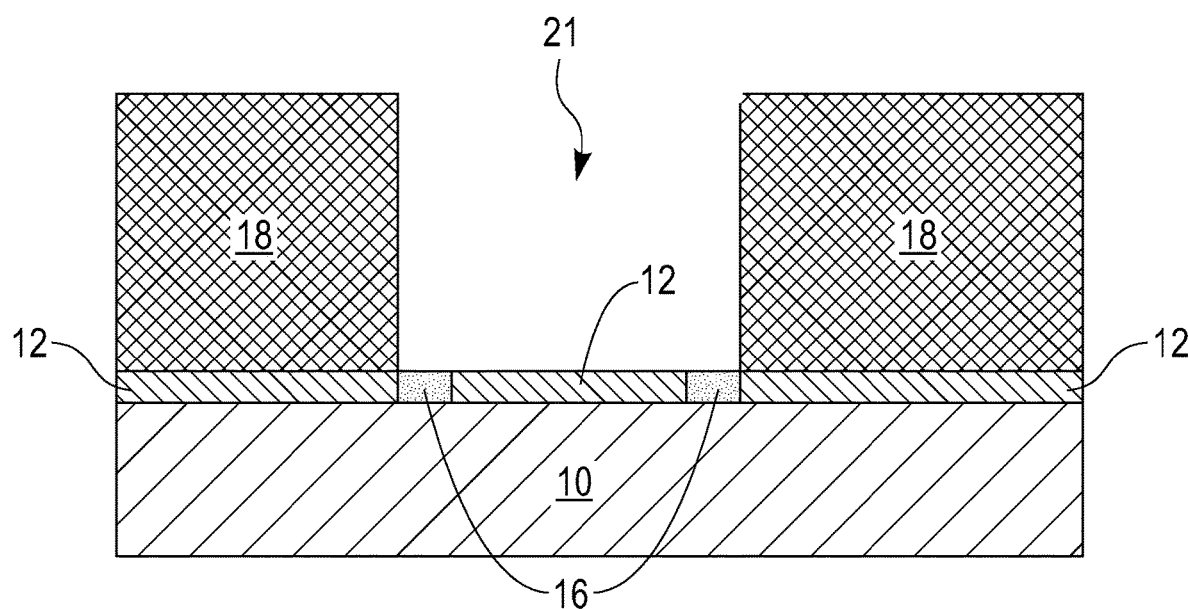
FIG. 5B is a cross sectional view of the exemplary electrical fuse of FIG. 4 after forming an opening in the interconnect dielectric material in accordance with another embodiment of the present application.

Referring now to FIG. 5B, there is illustrated the exemplary electrical fuse of FIG. 4 after forming an opening 21 in the interconnect dielectric material 18 in accordance with another embodiment of the present application. In this embodiment, opening 21 may be a via opening or a line opening. Opening 21 physically exposes the entirety of the dielectric material 12 that is located between the fuse element 16 as well as the fuse element 16 itself. In some embodiments, an entirety of the fuse element 16 is physically exposed. In other embodiments, only a portion of the fuse element 16 is physically exposed. The opening 21 is formed utilizing lithography and etching.

Figure 6A:
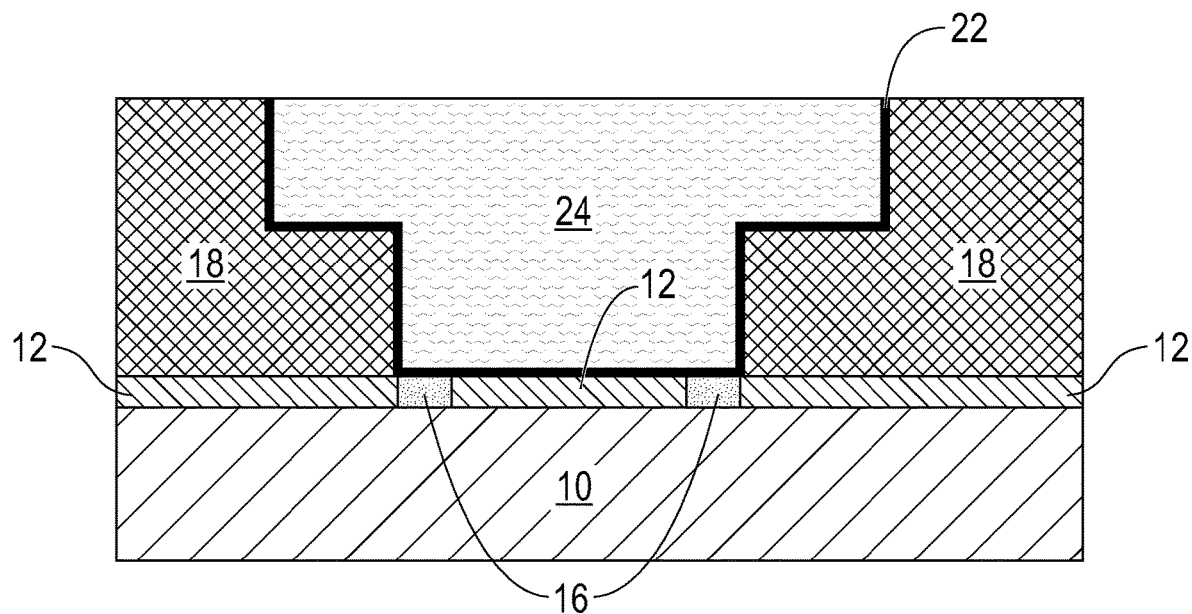
FIG. 6A is a cross sectional view of the exemplary electrical fuse of FIG. 5A after forming a second electrode in the lower via portion and the upper line portion of the opening.

Referring now to FIG. 6A, there is illustrated the exemplary electrical fuse of FIG. 5A after forming a second electrode 24 in the lower via portion and the upper line portion of the opening 20. In some embodiments and as shown in FIG. 6A, a diffusion barrier liner 22 may be formed within the opening 20 as well. In other embodiments, diffusion barrier liner 22 formation may be omitted.

In accordance with the illustrated embodiment, a diffusion barrier material is first formed into the opening 20 and on a physically exposed topmost surface of the interconnect dielectric material 18; the diffusion barrier material will provide the diffusion barrier liner 22 mentioned above. The diffusion barrier material may include Ta, TaN, Ti, TiN, Ru, RuN, RuTa, RuTaN, W, WN or any other material that can serve as a barrier to prevent a conductive material from diffusing there through. The thickness of the diffusion barrier material may vary depending on the deposition process used as well as the material employed. In some embodiments, the diffusion barrier material may have a thickness from 2 nm to 50 nm; although other thicknesses for the diffusion barrier material are contemplated and can be employed in the present application as long as the diffusion barrier material does not entirely fill the opening 20. The diffusion barrier material can be formed by a deposition process including, for example, CVD, PECVD, ALD, PVD, sputtering, chemical solution deposition or plating.

In some embodiments, an optional plating seed layer (not specifically shown) can be formed on the surface of the diffusion barrier material. In cases in which the conductive material to be subsequently and directly formed on the first diffusion barrier material, the optional plating seed layer is not needed. The optional plating seed layer is employed to selectively promote subsequent electroplating of a pre-selected electrically conductive metal or metal alloy. The optional plating seed layer may be composed of Cu, a Cu alloy, Jr, an Jr alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the opening 20. The thickness of the optional plating seed layer may vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, or PVD.

An electrically conductive metal or metal alloy is formed into the opening 20 and, if present, atop the diffusion barrier material. The electrically conductive metal or metal alloy provides the second electrode 24 of the present application. The electrically conductive metal or metal alloy may be composed of one of the metal or metal alloys mentioned above for the first electrode 10. In some embodiments, the first and second electrodes (10, 24) are composed of a same electrically conductive metal or metal alloy. In other embodiments, the first and second electrodes (10, 24) are composed of a compositionally different electrically conductive metal or metal alloy. The electrically conductive metal or metal alloy that provides the second electrode 24 may be formed utilizing one of the deposition processes mentioned above in forming the first electrode 10 In some embodiments, the electrically conductive metal or metal alloy that provides the second electrode 24 is formed above the topmost surface of the interconnect dielectric material 18.

Following the deposition of the electrically conductive metal or metal alloy, and in some embodiments, a planarization process such as, for example, chemical mechanical polishing (CMP) and/or grinding, can be used to remove all portions of the electrically conductive metal or metal alloy (i.e., overburden material) that are present outside the opening 20 and atop the interconnect dielectric material 18 forming the second electrode 24. The planarization stops on a topmost surface of the interconnect dielectric material 18. If present, the planarization process also removes the diffusion barrier material from the topmost surface of the interconnect dielectric material 18. The remaining portion of the diffusion barrier material that is present in the opening 20 is referred to herein as the diffusion barrier liner 22, while the remaining electrically conductive metal or metal alloy that is present in the opening 20 may be referred to as the second electrode 24. The second electrode 24 may be referred to as a top electrode of the electrical structure of the present application, while the first electrode 10 may be referred to as a bottom electrode of the electrical fuse of the present application.

As is shown, the second electrode 24 has a topmost surface that is coplanar with a topmost surface of the interconnect dielectric material 18, and if present, the topmost surfaces of the optional diffusion barrier liner 22.

Figure 6B:
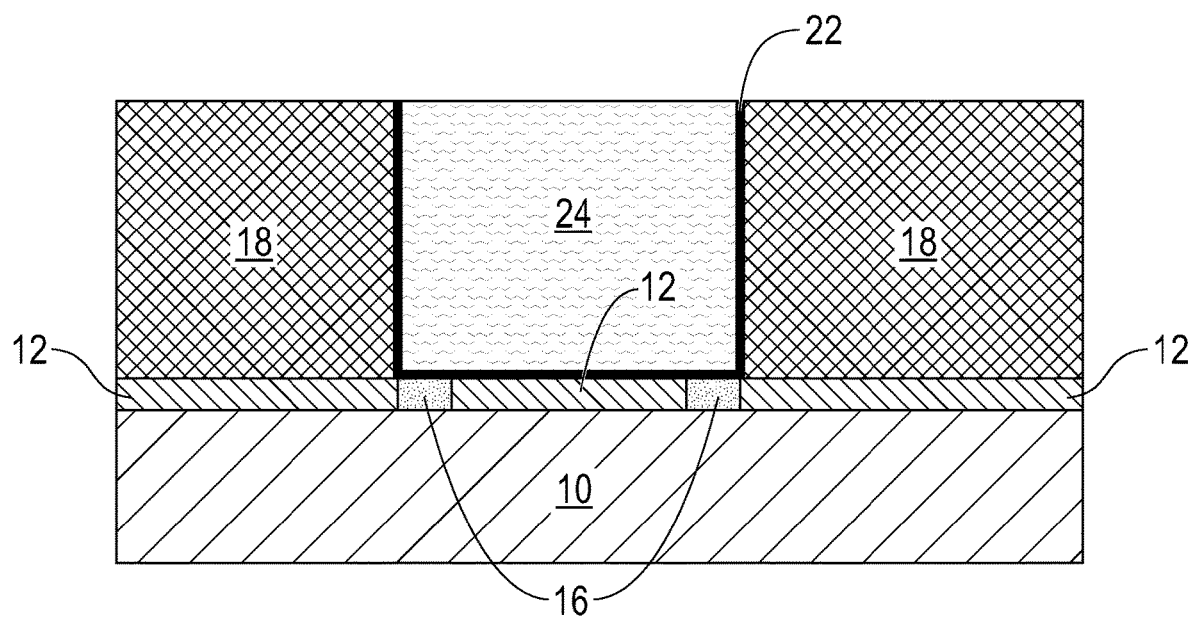
FIG. 6B is a cross sectional view of the exemplary electrical fuse of FIG. 5B after forming a second electrode in the opening.

Referring now to FIG. 6B, there is illustrated the exemplary electrical fuse of FIG. 5B after forming a second electrode 24 in the opening 21. In some embodiments and as shown in FIG. 6B, a diffusion barrier liner 22 may be formed within the opening 21 as well. In other embodiments, diffusion barrier liner 22 formation may be omitted.

The optional diffusion barrier liner 22, and the second electrode 24 are composed of materials mentioned above in the embodiment depicted in FIG. 6A of the present application. Also, the optional diffusion barrier liner 22, and the second electrode 24 can be formed utilizing the processes details mentioned above for providing the exemplary electrical fuse shown in FIG. 6A.

In either embodiment (shown in FIGS. 6A and 6B), an electrical fuse in accordance with the present application is provided. The electrical fuse includes a fuse element 16 having a circular ring shape comprising an outer perimeter sidewall, 16A, and an inner perimeter sidewall, 16B, and located on a first electrode 10. A dielectric material 12 laterally surrounds the inner perimeter sidewall, 16B, and the outer perimeter sidewall, 16A, of the fuse element 16. A second electrode 24 is located above, and in contact, with the fuse element 16.

As is shown, the majority of the second electrode 24 contacts the dielectric material 12 that is located in the center of the circular ring shaped fuse element 16, and the fuse element 16 only contacts an end portion of the second electrode 24. Limited contact area between fuse element 16 and the first and second electrodes (10, 24) is provided by forming the circular ring shaped fuse element in which dielectric material 14 is contained within the center of the circular ring-shaped fuse element 16. The limited contact area affords improved programming efficiency to the electrical fuse of the present application. Also, higher electron density is provided by the electrical fuse of the present application.

Although the present application describes and illustrates the formation of a single electrical fuse, a plurality of electrical fuses in accordance with the present application can be formed laterally adjacent or directly atop each other.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An electrical fuse comprising:
a first electrode;
a fuse element having a circular ring shape with a circular opening present therein, wherein the circular ring shape comprises an outer perimeter sidewall and an inner perimeter sidewall, wherein the fuse element is in direct physical contact with a topmost surface of the first electrode;
a dielectric material laterally surrounding the inner perimeter sidewall and the outer perimeter sidewall of the fuse element, wherein the dielectric material laterally surrounding the inner perimeter sidewall is a solid dielectric material that entirely fills in the circular opening; and
a second electrode located above, and in contact with, the fuse element.

2. The electrical fuse of claim 1, wherein the dielectric material has a topmost surface that is coplanar with a topmost surface of the fuse element.

3. The electrical fuse of claim 1, wherein the second electrode is embedded in an interconnect dielectric material.

4. The electrical fuse of claim 3, wherein the second electrode includes a lower via portion and an upper line portion.

5. The electrical fuse of claim 3, further comprising a diffusion barrier liner located on sidewall surfaces and a bottommost surface of the second electrode.

6. The electrical fuse of claim 1, wherein the second electrode further contacts the dielectric material that laterally surrounds the inner perimeter sidewall of the fuse element.

7. The electrical fuse of claim 1, wherein the fuse element comprises an electrically conductive metal or metal alloy.

8. The electrical fuse of claim 7, wherein the electrically conductive metal or metal alloy that provides the fuse element is the same as an electrically conductive metal or metal alloy that provides at least one of the first electrode and the second electrode.

9. The electrical fuse of claim 7, wherein the electrically conductive metal or metal alloy that provides the fuse element is compositionally different from an electrically conductive metal or metal alloy that provides at least one of the first electrode and the second electrode.

10. The electrical fuse of claim 1, wherein the dielectric material that laterally surrounds the inner perimeter sidewall of the fuse element is cylindrical in shape.

11. The electrical fuse of claim 10, wherein the dielectric material that laterally surrounds the inner perimeter sidewall of the fuse element has a diameter from 5 nm to 500 nm.

* * * * *